United States Patent [19]

Nooyen

[11] Patent Number: 5,053,684
[45] Date of Patent: Oct. 1, 1991

[54] DISPLAY TUBE CONTROL SYSTEM

[75] Inventor: Marinus A. M. Nooyen, Aarle-Rixter, Netherlands

[73] Assignee: PPG Hellige B.V., Best, Netherlands

[21] Appl. No.: 354,276

[22] Filed: May 19, 1989

[30] Foreign Application Priority Data

May 20, 1988 [NL] Netherlands ............... 8801319

[51] Int. Cl.⁵ ............... G01R 13/28; G09G 1/04; G09G 1/14
[52] U.S. Cl. ............... 315/392; 340/745; 340/748
[58] Field of Search ............... 315/395, 392, 365; 340/744, 745, 747, 748

[56] References Cited

U.S. PATENT DOCUMENTS 3,599,033  8/1971  Stettiner et al. ............... 315/384
4,821,030  4/1989  Batson et al. ............... 340/712

Primary Examiner—Gregory C. Issing
Attorney, Agent, or Firm—Fleit, Jacobson, Cohn, Price, Holman & Stern

[57] ABSTRACT

System for controlling the position and intensity of an electron beam in a display tube of a display unit in such a manner that both analog signals as well as alphanumeric characters can be made visible simultaneously on the screen of the display tube. The period necessary for displaying a complete picture on the screen of the display tube is divided in two successive sub periods, a first sub period in which a sawtooth shaped signal is supplied to the X-deflection means, a number of analog signals superimposed onto a staircase bias signal is supplied to the Y-deflection means, the number of sawtooth slopes in said sawtooth shaped signal being equal to said number of analog signals, and a line fligh back suppression signal is delivered to the Z-control means, and a second sub period in which a first further sawtooth shaped signal is supplied to the X-deflection means, a second further sawtooth shaped signal is supplied to the Y-deflection means and alphanumeric character control signals are supplied to the Z-control means.

7 Claims, 3 Drawing Sheets

DISPLAY TUBE CONTROL SYSTEM

The invention relates to a system for controlling the position and intensity of an electron beam in a display tube of a display unit in such a manner that both analog signals as well as alphanumeric characters can be made visible simultaneously on the screen of the display tube, the display unit comprising X-deflection means for deflecting the electron beam in the X-direction, Y-deflection means for deflecting the electron beam in the Y-direction and Z-control means for controlling the intensity of the light spot, written by the electron beam on the screen of the display tube.

Such systems are known from the state of the art and can be divided in two categories dependent on the control method. The first category relates to systems in which an XY-control method is applied. This category covers for instance oscilloscopes. To realize an XY-control the deflection yoke used for deflecting the electron beam in the X-direction is supplied with a sawtooth shaped signal, whereas the deflection yoke for deflection in the Y-direction is supplied with the analog signal to be displayed. If furthermore during the slope of the sawtooth shaped control signal the instensity of the display picture is controlled at a visible level than on the screen a display of the analog signal will be obtained. Instead of the sawtooth shaped control signal for moving the electron beam in the X-direction also another control signal can be supplied, for instance for displaying so-called Lissajous-figures or other types of the vector displays onto the screen.

The second category of said mentioned systems covers for instance television sets. Therein the X-deflection yoke is supplied with a relatively high frequency sawtooth shaped signal, whereas simultaneously the Y-deflection yoke is supplied with a relatively low frequency saw tooth shaped signal. In combination both sawtooth shaped signals will take care that the electron beam in a known way scans the whole screen of the cathode ray tube one line after the other. The actual picture signal is supplied to the intensity control means which will take care that during the scanning of the screen each pixel of the screen obtains the correct intensity.

If a display unit, which in principle is developed for XY-control, has to be used to display alpha-numeric symbols on the screen, then X-and Y-control signals have to be generated in such a way that each alpha-numeric symbol is written separately on the screen by means of the electron beam. In the past signal generators destined specifically for this purpose are indeed developed. A disadvantage of these generators, however, is that they are rather complex and that with large numbers of alpha-numeric symbols or more complicated symbols a relatively long time period is necessary for writing these symbols on the screen. Furthermore in practice it is very awkward if not impossible to present further analog signals on the screen besides these alpha-numeric symbols.

If on the other hand a display unit, functioning according to the image scanning method has to be used for displaying analog signals and then in a disadvantageous way the analog signals are sampled by the line scanning, with the result that minor details of the analog signals will be lost. This is visible on each normal television screen.

The purpose of the invention is now to provide a system for controlling the position and intensity of an electron beam in a cathode ray tube of a display unit in such a way that on the one hand analog signals can be displayed without loss of details, whereas on the other hand in a very simple way alpha-numeric symbols can be displayed both at arbitrarely selectable positions on the screen of the display unit.

In agreement with said object the system of the abovementioned type is characterized in that the period necessary for displaying a complete picture on the screen of the display tube is divided in two successive sub periods, a first sub period in which a sawtooth shaped signal is supplied to the X-deflection means, a number of analog signals superimposed onto a staircase bias signal is supplied to the Y-deflection means, the number of sawtooth slopes in said sawtooth shaped signal being equal to said number of analog signals, and a line fly back suppression signal is delivered to the Z-control means, thereby obtaining an X-Y-control of the electron beam, and a second sub period in which a first further sawtooth shaped signal is supplied to the X-deflection means, a second further sawtooth shaped signal is supplied to the Y-deflection means and alpha-numeric character control signals are supplied to the Z-control means, thereby obtaining an image scanning control of the electron beam.

During said first period an XY-control method is used whereby one or more analog signals can be displayed on the screen without loss of any details. Also during said first period for instance Lissajous-figures or other vector displays can be made visible on the screen. Thereby arbitrarily the whole screen or a part of the screen can be used. If only a part of the screen is used, than the deflection can be restricted to that specific part of the screen with the result that said first period can be shortened.

During the second period an image scanning method is used whereby at predetermined positions alpha-numeric symbols are displayed on the screen. Also in this period the whole screen can be scanned or only a part thereof, but in general scanning of the whole screen in this image scanning period will be preferred.

It is remarked that a system for simultaneously displaying analog signals and alphanumeric characters on the screen of a display tube is described in the French patent No. 2.472.799. The therein described system, however, does not use a clear subdivision between a first period in which X-Y-deflection control is used and for displaying the analog signals and a second sub period in which a frame scanning method is used for displaying the alphanumeric characters. In this prior art apparatus rather complicated complex sawtooth shaped signals are used specifically designed to control the deflection in the X-direction such that in a first subsection of each scanning line analog signals can be displayed whereas in a second sub section of each line a part of the alphanumeric information can be displayed. The various signal generators in this prior art system have to be designed in a specific way to obtain a predetermined layout on the screen. Any other layout requires a redesign of the signal generators. This prior art system therefore has no flexibility.

In a normal television set the separate lines of a complete image are scanned in the horizontal direction. In a system according to the invention it is, however, preferred to scan the lines in a vertical direction, especially in embodiments of the system destined for displaying analog signals during said first period. In that case the relatively high frequency sawtooth shaped signals necessary for the line scanning, are supplied to the same deflection yoke to which during said first period the analog signals are supplied, which analog signals also can be relatively high frequency signals. Both during said first as well as during said second period the signal supplied to the other deflection yoke is a relatively low frequency signal. The result thereof will be that only one of the deflection yokes with the corresponding driver stage should be embodied such that relatively high frequency signals can be processed therewith.

Further details of the invention will be explained with reference to the attached drawings.

Figure 1:
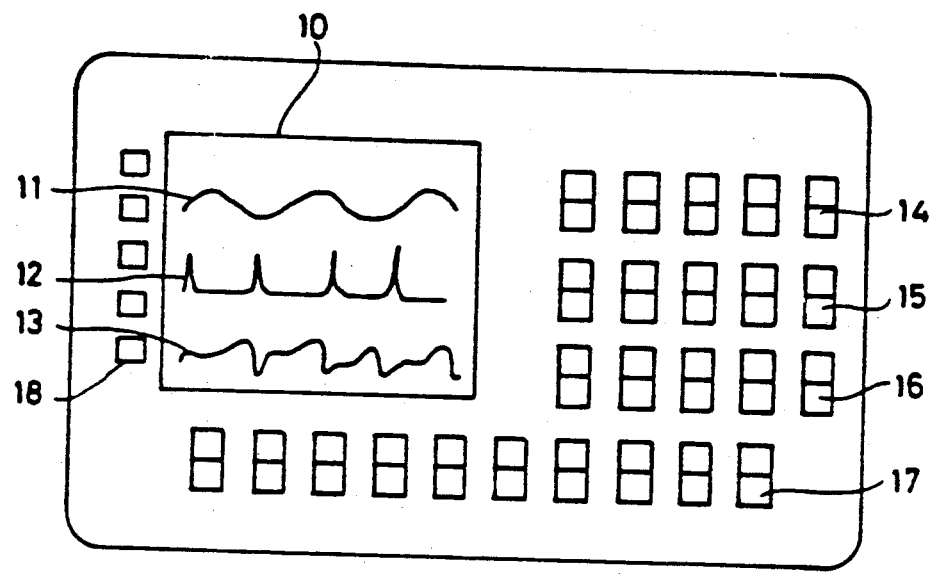
FIG. 1 illustrates a picture which, by means of the invention can be displayed on a display screen.

FIG. 1 illustrates schematically an example of a picture which in agreement with the invention can be made visible onto the screen of a display system. The picture comprises within the frame 10 a number of analog signals 11, 12 and 13 and outside the frame alpha-numeric symbols are displayed at various positions, such as the rows of symbols 14, 15, 16, and the subscript 17 as well as the highlighted rectangles at the left side of the frame 10 one of which is referenced by 18. The actual contents of the rows of alpha-numeric symbols 14 through 18 is not relevant within the scope of the invention. The rows 14, 15, 16 can be related for instance to the analog signals 11, 12 and 13 displayed at the left side thereof. The subscript 17 may give an explanation of the the picture as whole whereas the rectangles 18 can be destined for instance as selectable touch pads if a so-called "touch screen" is used.

When such a picture is displayed then in general it will be desirable that the analog signals 11, 12 and 13 are made visible on the screen as sharp as possible maintaining thereby all the finer details. Preferably therefore an XY-control method respectively tY-control method has to be used for displaying these signals within the frame 10.

In principle the alpha-numeric characters whithin the rows 14 until 18 outside the frame 10 have to comply only with the requirement that these characters have to be well-readable. An eventual low distortion caused by the application of an image scanning method is in general acceptable. Because in general it is much easier to display alpha-numeric characters by means of an image scanning method instead of using an XY-scanning method, it is preferred to write a part of the screen by means of an image scanning method.

Figure 2:
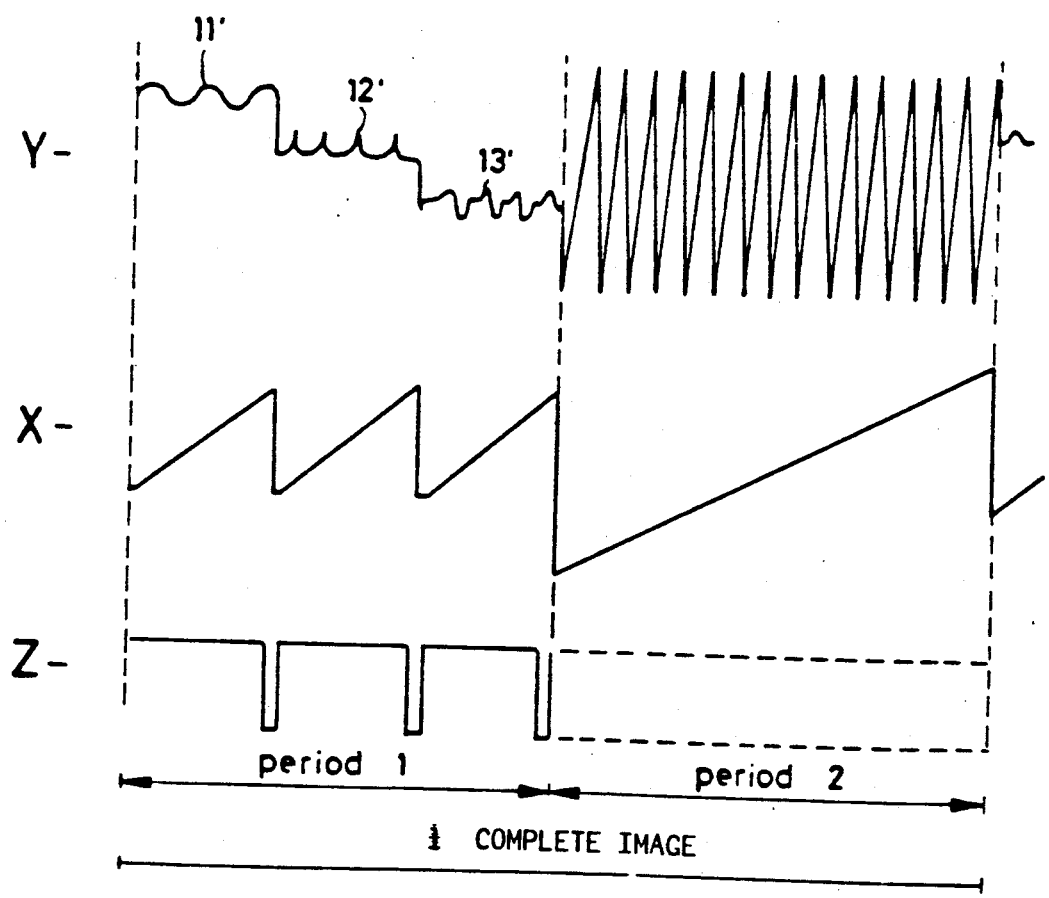
FIG. 2 illustrates the signals to the deflection yokes for controlling a display tube in agreement with the invention.

If one uses a display unit having a display tube comprising an X-deflection yoke for deflection in the X-direction, an Y-deflection yoke for deflection in the Y-direction and one or more electrodes by means of which an intensity control can be realized than FIG. 2 indicates in which way the picture illustrated in FIG. 1 can be displayed.

In FIG. 2 the X-control signal, Y-control signal and Z-control signal, (intensity control) are shown one underneath the other. Each of these three signals is in fact periodical, the period of these signals being equal to the image repetition frequency. The image repetition frequency is perferably larger than 25 Hz and more specifically larger than 50 Hz. In FIG. 2 the shape of the signals necessary to build one complete image is illustrated. Within one image two display periods can be distinguished, which in FIG. 2 are indicated as period 1 and period 2. Within period 1 the analog signals inside frame 10 are displayed and within period 2 the various alpha-numeric symbols outside frame 10 are displayed.

Within period 1 the X-control signal consists of a number of sawtooth shaped signals, the number of which equals the number of analog signals to be displayed (in the underlying example three signals, i.e. the analog signals 11, 12 and 13 have to be displayed). Within said period 1 the Y-deflection signal is formed by the succeeding analog signal parts 11', 12' and 13' which are superimposed onto a staircase shaped dc-component. It will be clear for the expert in this field that the combination of these X- and Y-control signals within period 1 will result into the display of the analog signals 11, 12 and 13 underneath each other as is indicated in FIG. 1. An additional requirement is that the Z-control during the rising edges of the sawtooth signals is suitable to obtain a visible signal on the screen, whereas during the trailing edges of the scanning sawtooth (the line fly back period) the electron beam in the tube is suppressed. The corresponding Z-control signal is indicated in FIG. 2.

In period 2 the X-control signal is formed by one single slope of a relatively low frequency sawtooth shaped signal, whereas the Y-signal consists of a relatively high frequency sawtooth shaped signal. It will be clear for the expert in this field that the combination of the these X- and Y-control signals results in a line for line scanning of the whole picture on the screen, whereby in contrast to a normal television picture the scanning lines are running vertically on the screen of the cathode ray tube. If during this period 2 a suitable Z-control signal is supplied then predetermined pixels will be controlled light and dark in correspondence with this Z-control signal, which with suitable control information results into the display of the desired rows of alpha-numeric symbols 14 until 18. The Z-signal is within period 2 indicated schematically in FIG. 2. If it is not necessary to display alpha-numeric characters inside the frame 10, then within frame 10 the electron beam will be controlled to a dark intensity by the Z-control signal. This is however, not a very stringent requirement. Within the scope of the invention it is also possible to display alpha-numeric characters inside the frame 10, for instance to attract attention to parts of the analog signals 11, 12 and 13.

It is indicated above that the scanning lines during period 2 are running vertically. Vertically running scanning lines are selected because therewith the X-control signal comprises only relatively low frequency components whereas all relatively high frequency components are combined in the Y-control signal. The result thereof is that only the Y-driver stages, the Y-amplifiers and the deflection yoke have to be developed and embodied such that high frequency signals can be processed. The drivers, amplifiers and yokes for the X-deflection have to be suitable only for the processing or relatively low frequency signals and have to satisfy therefore much lower requirements.

Figure 3:
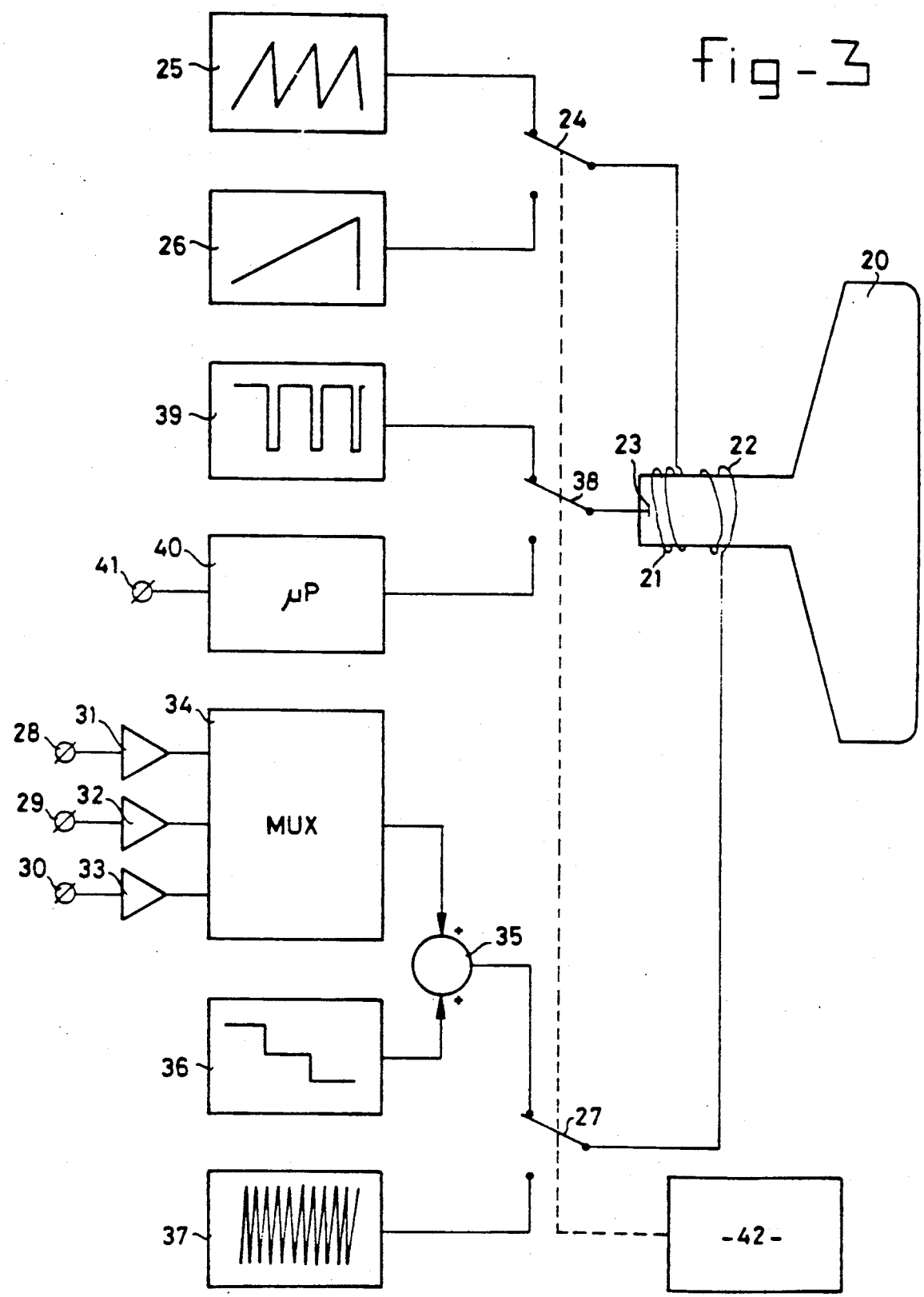
FIG. 3 illustrates a schematical diagram of a possible system for realizing the method according to the invention.

A system in which the control method according to the invention can be brought into practice is schematically illustrated in FIG. 3. The system comprises a cathode ray 20 with an X-deflection yoke 21 and an Y-deflection yoke 22 around the neck of the tube. The tube 20 comprises furthermore one or more electrodes 23 to which signals for the intensity control (the so-called Z-control signals) have to be supplied.

The X-deflection yoke receives through the switch 24 sawtooth signals supplied either by the generator 25 or by the generator 26. The generator 25 supplies sawtooth shaped deflection signals by means of which during the period 1 the analog signals 11, 12 and 13 are written on the screen of the cathode ray 20. The generator 26 supplies the relatively low frequency sawtooth signal which during period 2 is used to shift the vertical scanning lines in horizontal direction.

The vertical deflection yoke system 22 receives signals through the switch 27. During period 1 the signal inputs 28, 29 and 30 receive the respective analog signals 11, 12 and 13 which after amplification in the amplifiers 31, 32 and 33 are delivered to a multiplexer 34. The function of this multiplexer 34 is to supply the signals at the inputs 28, 29 and 30 in successive order to a summing point 35 in which these analog signals are combined with a staircase signal delivered by the generator 36. It will be clear that at the output of the summing point 35 a signal appears with the shape as is illustrated in FIG. 2 within period 1 of the Y-control signal. This signal is through the switch 27 supplied to the Y-deflection yoke 22.

During period 2 the switch 27 guides signals from the sawtooth generator 37 to the Y-deflection yoke. These sawtooth signals produce the line scanning signals during period 2.

Finally the intensity control signals are supplied to the thereto destined electrodes 23 through a switch 38. During period 1 the switch 38 guides the signals from a generator 39 by means of which the analog signals 11, 12 and 13 are displayed with visible intensity whereas during the line-flyback period the signals are suppressed by means of negative pulses. During period 2 the switch 38 guides the control signals from a microprocessor 40 which in turn receives input signals through input 41. The mircroprocesssor 40 generates the suitable control signals for displaying a number of alpha-numeric characters dependent on input signals on the input 41. It is for instance possible that the input 41 is connected to suitable input means such as a keyboard, etc. The generation of control signals for displaying alpha-numeric characters by means of a microprocessor 40 is considered as known to the expert in this field.

As is illustrated schematically in FIG. 3 the switches 24, 27 and 38 are controlled synchroneously by a switch control unit 42 in such a manner that during period 1 the switches are in the position illustrated in FIG. 2. The control signal source 42 will take care that during period 2 all the switches 24, 27 and 38 are switched over to the other position which is not illustrated in FIG. 2.

It will be clear to the expert in this field that it is not necessary to embody the various signal sources illustrated in FIG. 2 separately from each other. Various generators can be combined whereby simultaneously the necessary synchronization between the various signal sources can be realized. All this does not need further explanation. Also the switch over between period 1 and period 2 can be realized by other means instead of the illustrated switches.

Referring back to FIG. 2 it probably will have drawn the attention that during period 1 the X-deflection signals have a smaller amplitude than the relatively slower sawtooth signal during period 2. The result thereof is that during period 1 only that part of the display screen is scanned which is delimited by the frame 10. Also the bias signal supplied by the generator 36 and the amplitudes of the various analog signals 11, 12 and 13 are selected such that the space within the frame 10 is not exceeded. The result thereof is that any superfluous scanning of those parts of the screen, where no signals have to be written, is avoided. Furthermore therewith the period 1 is shortened as much as possible.

As already remarked above during period 2 it is not only possible to display alpha-numeric characters outside the frame 10 in FIG. 1, also within the frame 10 alpha-numeric characters can be displayed superimposed onto the analog signals. Of course these alpha-numeric characters can be shaped as lines or line-segments as well as other graphical elements. Therewith for instance a picture can be realized as is schematically indicated in FIG. 4.

Figure 4:
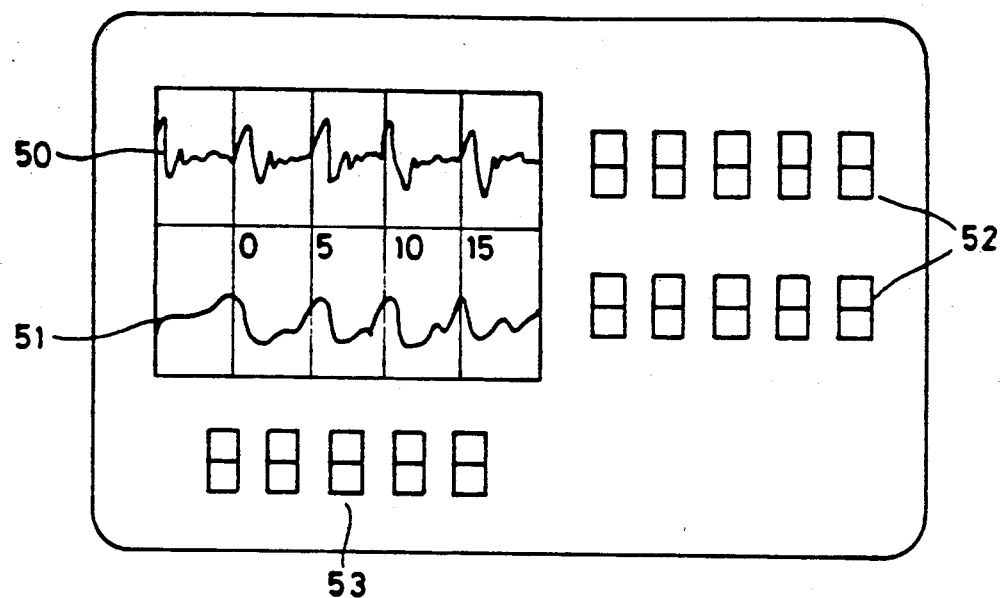
FIG. 4 shows another picture which can be displayed by means of the invention.

In FIG. 4 a part of the screen is used to display analog signals 50 and 51 and around this part rows of alpha-numeric symbols are displayed, which in FIG. 4 are referenced by 52 and 53. Inside that part of the screen, where the analog signals 50 and 51 are displayed a dividing grid is displayed during period 2 comprising for instance in the center a horizontal scale whereby scale values (0, 5, 10) are made visible.

Figure 5:
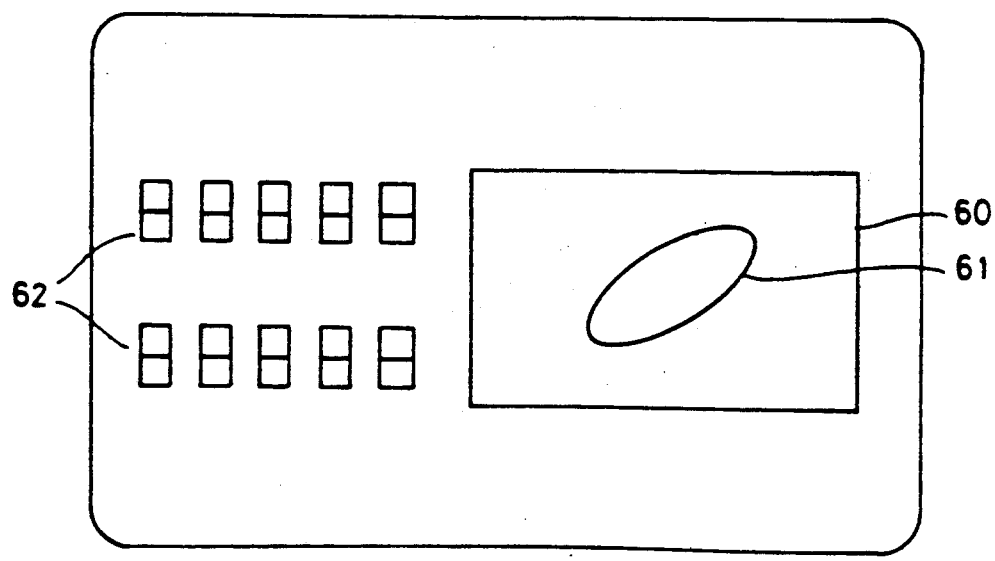
FIG. 5 illustrates a further picture in which besides alpha-numeric information also Lissajous-figures are displayed.

An other possible picture on the screen is displayed in FIG. 5. Also in this case one can distinguish between a part of the screen inside the frame 60 in which Lissajous-figures, such as 61 in FIG. 4 can be displayed, and the part outside the frame 60 where alpha-numeric information 62 is displayed. It will be clear for the expert in this field that for presenting Lissajous-figures a modified version of the system in FIG. 3 will be necessary. Especially the sawtooth generator 26 will have to be replaced by an amplifier for processing an external control signal or by a suitable signal generator.

The system according to the invention can for instance be used in a monitor unit for medical applications, used for instance to display simultaneously the hart beat, breathing movements, blood pressure, etc., together with alpha-numeric information relating to these signals. Monitors like these are known as such.

I claim:

1. System for controlling the position and intensity of an electron beam in a display tube of a display unit in such a manner that both analog signals as well as alpha-numeric characters can be made visible simultaneously on the screen of the display tube, the display unit comprising X-deflection means for deflecting the electron beam in the X-direction, Y-deflection means for deflecting the electron beam in the Y-direction and Z-control means for controlling the intensity of a light spot, written by the electron beam on the screen of the display tube, wherein the period necessary for displaying a complete picture on the screen of the display tube is divided in two successive sub periods, a first sub period in which an analog signal is supplied to the Y-deflection means and a relatively low frequency sawtooth shaped signal is supplied to the X-deflection means for scanning the width of the screen area on which said analog signal is to be displayed, and in which a beam fly back suppression signal is delivered to the Z-control means, thereby obtaining an X-Y-control of the electron beam such that for each scan of said sawtooth signal during said first sub period an uninterrupted image of the analog signal is written on the screen within said area, and a second sub period in which a first further relatively low frequency sawtooth shaped signal is supplied to the X-deflection means, a second further relatively high frequency sawtooth shaped signal is supplied to the Y-deflection means and alphanumeric character control signals are supplied to the z-control means, thereby obtaining an image scanning control of the electron beam during said second sub period whereby the scanning lines effected by said second further relatively high frequency sawtooth shaped signal are directed according to the Y-direction.

2. System according the claim 1, characterized in that during said second sub period the relatively low frequency sawtooth shaped signal comprises only one sawtooth slope is supplied to the X-deflection means and the sawtooth shaped signal supplied to the Y-deflection means has a number of slopes being equal to the desired number of scanning lines on the screen of the display tube.

3. System according to claim 1, characterized in that the sawtooth shaped signal supplied during said first period to the X-deflection means and a staircase bias signal supplied to the Y-deflection means are dimensioned such that only a predetermined part of the whole screen of the display tube is used for displaying the analog signals, which are superimposed onto said staircase bias signals supplied to the Y-deflection means.

4. System according to claim 1, characterized in that at least part of the analog characters, to be displayed during the second sub period, are displayed within that part of the screen of the display tube in which also the analog signals are displayed.

5. System according to claim 4, characterized in that at least part of said alphanumeric characters which are displayed in the same section of the screen as the analog signals, are shaped as line segments, which characters together are forming a grid dividing the respective section of the screen into rectangles of predetermined dimension.

6. System according to claim 1, characterized in that the display unit has a touch sensitive screen whereby a number of the alphanumeric characters to be displayed during said second sub period indicate touch sensitive areas of said sensitive screen.

7. System according to claim 1, characterized in that the area in which the analog signal is displayed during the first sub period, being dependent on the parameters of the sawtooth shaped signal and dependent on the amplitude of the analog signal, and the area in which the alphanumeric characters are displayed during the second sub period, being dependent on the parameters of both the first and second further sawtooth shaped signal, are at least partly overlapping each other.

* * * * *